US010405447B2

(12) United States Patent
Bonnet

(10) Patent No.: US 10,405,447 B2
(45) Date of Patent: Sep. 3, 2019

(54) PRINTED CIRCUIT BOARD

(71) Applicant: INGENICO GROUP, Paris (FR)

(72) Inventor: Eric Bonnet, Malissard (FR)

(73) Assignee: INGENICO GROUP, Paris (FR)

( * ) Notice: Subject to any disclaimer, the term of this patent is extended or adjusted under 35 U.S.C. 154(b) by 15 days.

(21) Appl. No.: 14/931,424

(22) Filed: Nov. 3, 2015

(65) Prior Publication Data
US 2016/0128218 A1 May 5, 2016

(30) Foreign Application Priority Data

Nov. 3, 2014 (FR) ...................... 14 60599

(51) Int. Cl.
*G06K 7/00* (2006.01)
*G07F 7/08* (2006.01)
*H05K 1/18* (2006.01)
*H05K 7/02* (2006.01)

(52) U.S. Cl.
CPC ........... *H05K 7/026* (2013.01); *G06K 7/0056* (2013.01); *G07F 7/0873* (2013.01); *H05K 1/181* (2013.01); *H05K 2201/09972* (2013.01); *H05K 2201/10189* (2013.01); *Y02P 70/611* (2015.11)

(58) Field of Classification Search
CPC ................. H05K 7/026; H05K 1/181; H05K 2201/09972; H05K 2201/10189; G06K 7/0056; G07F 7/0873
USPC ....................................................... 361/748
See application file for complete search history.

(56) References Cited

U.S. PATENT DOCUMENTS

| 6,373,511 | B1 * | 4/2002 | Groves | ...................... B41J 3/36 347/198 |
| 2010/0008057 | A1 * | 1/2010 | Bonnet | ................... G06F 21/86 361/796 |
| 2013/0054390 | A1 * | 2/2013 | Kerchner | ............. G07G 1/0045 705/17 |
| 2015/0327694 | A1 * | 11/2015 | Andre | ................. H04M 1/0216 312/326 |
| 2016/0021737 | A1 * | 1/2016 | Oh | ......................... H05K 3/284 361/772 |

FOREIGN PATENT DOCUMENTS

| CN | 202904762 U | 4/2013 |
| FR | 2795845 A1 | 1/2001 |
| FR | 2992094 A1 | 12/2013 |
| KR | 20140050168 A | 4/2014 |

OTHER PUBLICATIONS

English translation of the French Written Opinion dated Jun. 23, 2015 for French Application No. 1460599, filed Nov. 3, 2014.
French Search Report and Written Opinion dated Jun. 23, 2015 for French Application No. 1460599, filed Nov. 3, 2014.
European Search Report dated Apr. 3, 2016 for corresponding EP Application No. 15192237.

* cited by examiner

*Primary Examiner* — Michael P McFadden
(74) *Attorney, Agent, or Firm* — David D. Brush; Westman, Champlin & Koehler, P.A.

(57) ABSTRACT

A main printed circuit board, called a motherboard, of a payment terminal is provided on which a plurality of components is assembled. The components are assembled on the motherboard according to the height of the components so that the components of greater height are situated at a first end of the board and the components of smaller height are situated at a second end of the board.

7 Claims, 3 Drawing Sheets

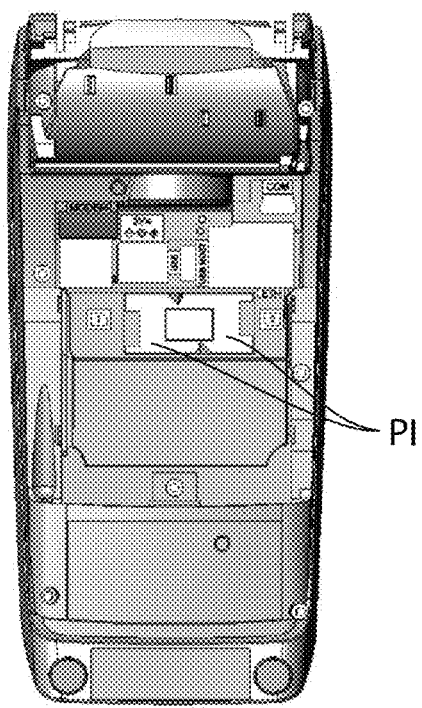
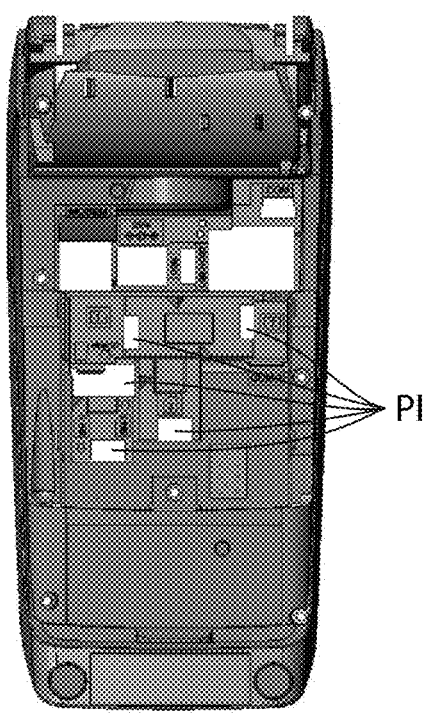
Figure 5
Figure 6

PRINTED CIRCUIT BOARD

1. FIELD OF THE DISCLOSURE

The present disclosure pertains to the field of payment terminals. The present disclosure pertains more particularly to the field of payment terminals known as fixed payment terminals.

The present disclosure pertains to a payment terminal known as a fixed payment terminal in which the architecture of the terminal is improved in order to facilitate its manufacture, reduce costs and facilitate the use of the payment terminal.

2. PRIOR ART

In the field of payment terminals, two classes of terminal can be distinguished. There are payment terminals known as "fixed" payment terminals and payment terminals known as "mobile" or "nomad" terminals. These two classes of terminal can be distinguished from each other chiefly by the type of electrical power system used and by the connection systems available. A "nomad" terminal is intended to be carried by a professional (for example a taxi-driver, a doctor, etc.) during his movements. To this end, a terminal of this kind comprises an autonomous power source (a battery) and a type of connectivity known as wireless connectivity (GPRS, Wi-Fi, Bluetooth, etc.). Ultimately, a nomad terminal is often a rather light and compact object. There also exist standards that can be used to define a payment terminal in terms of compactness.

On the contrary, a fixed terminal is often an object comprising more extensive connectivity and additional functions. A fixed terminal is characterized chiefly by its wired connectivity. Indeed, in addition to having a possible wireless connectivity, the fixed terminal has wired connectivity: this is provided for example by an RJ45 jack for access to a local network, an RJ11 jack for access to an RTC telephone network, one or more USB ports, one or more communications ports. This entire wired connection system can be accessed through the back of the terminal by removing a hatch.

Such an architecture is described with reference to FIGS. 1 and 2 representing an example of a payment terminal (10), and showing the lower half-casing of this terminal (10-1). These figures are of course non-exhaustive in terms of the scope of the present disclosure and serve only to explain a state of the prior art in order to understand the problems raised. FIGS. 1 and 2 represent the back of a fixed payment terminal (10) of the prior art. It comprises a hatch (11) for access to a set of jacks (11-1, 11-2, 11-3, 11-4, 11-5, 11-6) used to connect cables, especially a power cable, an RJ45cable, an RJ11 cable, two USB cables. During operation, the cables are connected to the different jacks and take position in positioning troughs or channels (12-1, 12-2, 12-3). In use mode, the hatch (11) is closed and the cables emerge from the terminal substantially in parallel to the plane of the resting surface of the payment terminal. The terminal also has a second hatch (13) for access to a set of connectors (13-1,13-2,13-3,13-4). These are for example connectors known as SAM or SIM connectors. There are also connectors for SD or microSD cards (13-1). SAM and SIM cards which can be inserted in this position are used for example for professional requirements (they may be the professional card of a dentist or a doctor). A SIM card can be inserted for purposes of communications: this is for example an identification card for a telephone operator (GPRS communication) so that the terminal can perform certain transactions.

As can be seen in FIG. 2 and FIG. 3, these connectors are positioned so as to overlap one another. It is not easy to insert the SIM, SAM or microSD cards into these connectors. From a general viewpoint, a terminal of this type raises several problems. The first problem pertains to the space requirement of this type of terminal, related to its full connection system. Another problem of this type of terminal, is related to the presence of two hatches: one hatch for the connection system and one hatch for the connectors. The presence of these two hatches greatly increases the cost of manufacture of the terminal. Besides, because of this architecture, the lower half-casing of the terminal is a part that is difficult and costly to produce.

Finally, this architecture raises an ergonomic problem: the insertion and withdrawal of the SIM and SAM cards is complicated by the lack of space available. These different cards are situated in different insertion planes. For example, certain volumes do not facilitate access to these insertion areas.

3. SUMMARY

An exemplary aspect of the present disclosure pertains to a printed circuit board and a payment terminal integrating such a board.

More particularly, the disclosure pertains to a main printed circuit board, known as a motherboard, of a payment terminal on which a plurality of components is assembled. According to the disclosure, said components of said plurality of components are assembled on said motherboard according to the height of said components so that the components of greater height are situated at a first end of the board and the components of smaller height are situated at a second end of the board.

According to one particular characteristic, said printed circuit board takes substantially the shape of a rectangle divided into at least one first area and at least one second area, said first area comprising components whose height exceeds a determined threshold.

According to one particular characteristic, said components of the first area are wired connection components.

According to one particular characteristic, said second area comprises SIM card or SAM card connection components.

According to one particular characteristic, said printed circuit board furthermore comprises at least one third area comprising components whose height is situated below a predetermined ceiling.

According to one particular characteristic, said printed circuit board furthermore comprises at least one optional board connector.

According to one particular characteristic, said printed circuit board is shaped to receive, above an area receiving components whose height is situated below a predetermined ceiling, an optional board connected to a specific connector of the printed circuit board.

According to one particular characteristic, the height of the connection components of the SIM or SAM connection cards of said second area is calculated so that said connection components of the SIM or SAM cards of said second area have a height substantially identical to that of components of a same nature which are mounted on an optional board which is connected to a specific connector of the printed circuit board situated in an area in the vicinity of said second area.

According to another aspect, this disclosure also relates to a lower half-casing of a payment terminal comprising a single plane of insertion of a plurality of data processing modules (SIM, SAM, microSD).

According to another aspect, said disclosure also pertains to a payment terminal comprising a printed circuit board as described here above.

4. FIGURES

Other features and advantages shall appear more clearly from the following description of a particular embodiment of the disclosure, given by way of a simple, illustrator and non-exhaustive example and from the appended drawings, of which:

FIG. 1, already commented upon, is an isometric bottom view of a prior-art payment terminal in which two hatches are use d to close the case;

FIG. 2, already commented upon, is an isometric bottom view of the same terminal as in FIG. 1, in which the two hatches are removed, revealing the connection elements of the terminal;

FIG. 5 is a front view of a lower half-casing comprising access holes to the connection elements adapted to the motherboard of FIG. 3;

FIG. 6 is a front view of a lower half-casing comprising access holes to the connection elements, adapted to the motherboard of FIG. 4.

5. EMBODIMENT

Figure 1:
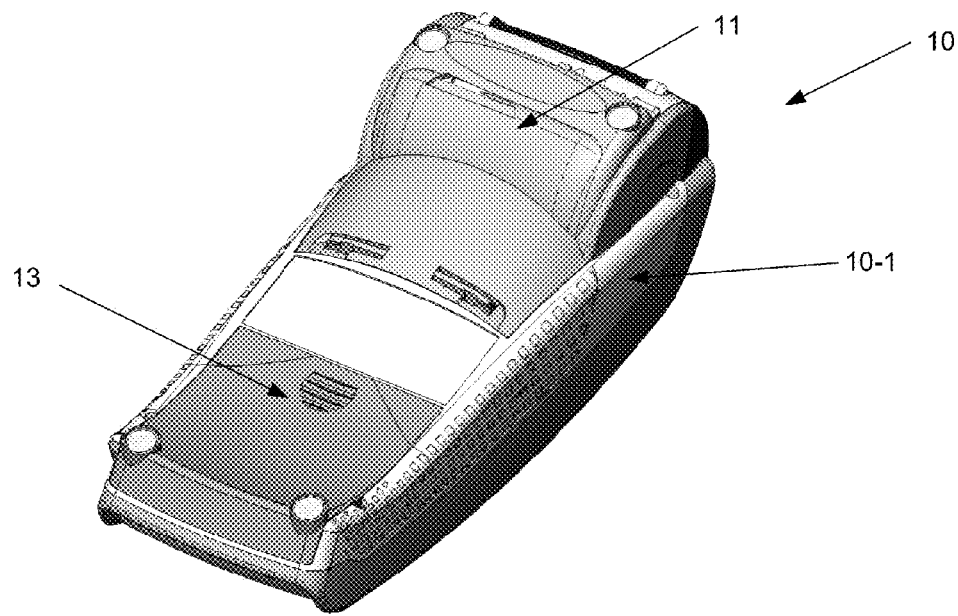
Figure 2:
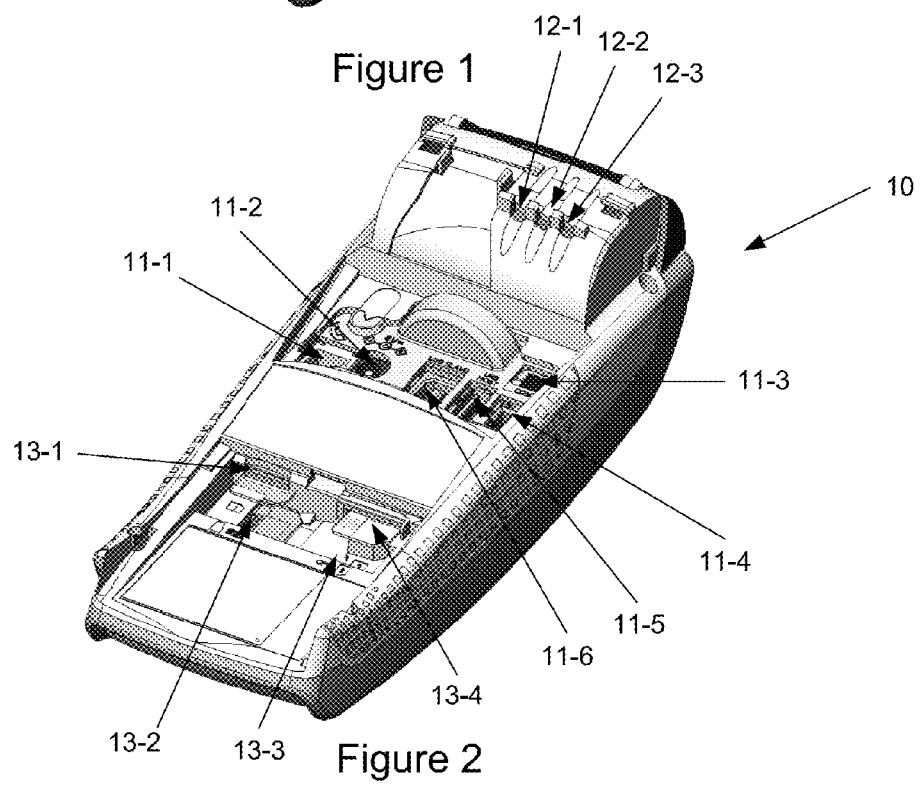

To overcome at least some drawbacks of the prior-art terminals, the general principle of an exemplary embodiment of the present disclosure consists in intelligently grouping together the components of the payment terminal in a novel and inventive architecture that offers the advantage of a fixed payment terminal and the compactness of a mobile payment terminal. It will be noted that the present technique is described with reference to a fixed payment terminal. However, it is quite possible to envisage the making of such a grouping of connectors in a mobile payment terminal, the difference being situated at the level of the types of components to be integrated. The result of this then is a mobile payment terminal that is even more compact than existing mobile payment terminals.

To this end, the inventors have had the idea of grouping the locations of the different functions of the payment terminal. This grouping, unlike the existing grouping, makes it possible to avoid having two hatches. This grouping also appreciably improves ergonomy: it is easier to insert the SIM and SAM cards into the payment terminals, especially because the proposed architecture prevents the stacking of the connectors, as is often the case with prior-art terminals.

Thus, the inventors have had the idea of laying out the locations of the components according to size: the components are assembled on the motherboard according to the height of said components, so that components of greater height are situated at a first end of the board and the components of smaller height are situated at a second end of the board.

As a rule, the printed circuit board has a substantially rectangular shape. According to the disclosure, it is divided into at least one first area and at least one second area, the first area comprising components whose height exceeds a determined threshold. This threshold can for example be situated in the range of 1 centimeter to 2 centimeters. It corresponds to wired connection components.

The second area comprises SIM or SAM card connection components. As shall be seen further below, the height of these components is adapted.

The printed circuit board furthermore comprises at least one third area comprising components whose height is below a predetermined ceiling. These are the least thick components such as for example the smartcard (payment card) connector or again a security processor. This threshold, which is of the order of 0.1 to 0.5 centimeters, is calculated as a function of the height taken by a future optional board as described here below.

The printed circuit board thus additionally comprises at least one optional board connector. The printed circuit board is shaped to receive an optional board above an area receiving components whose height is situated below a predetermined threshold. This optional board is connected to a specific connector of the printed circuit board.

The height of the components of the SIM or SAM cards of the second area is designed so that the connection components of the SIM or SAM cards of the second area have a height substantially identical to components of a same nature that are mounted on an optional board which is connected to a specific connector of the printed circuit board situated in an area in the vicinity of the second area.

The disclosure also comprises a lower half-casing of a payment terminal characterized in that it comprises a single plane of insertion of a plurality of data processing modules (SIM, SAM, Micro SD). Thus, the ergonomy of use of the terminal is greatly facilitated.

Thus, the drawbacks of the prior art are resolved especially through the designing of a new motherboard for the payment terminal. This motherboard, which is essentially rectangular, comprises several areas for attaching electrical components. More particularly, according to the present disclosure, the electronic components of similar or equivalent heights are grouped together. This grouping makes it possible to set the card at different levels and, in this embodiment, to define three areas for attaching electronic components or connectors. The first attachment area is called an area [A], and is occupied by the cable jacks. The second attachment area is called an area [B] and is occupied by the SIM or SAM connectors. The third attachment area is called an area [C] and is occupied by electronic components of small height.

Figure 3:
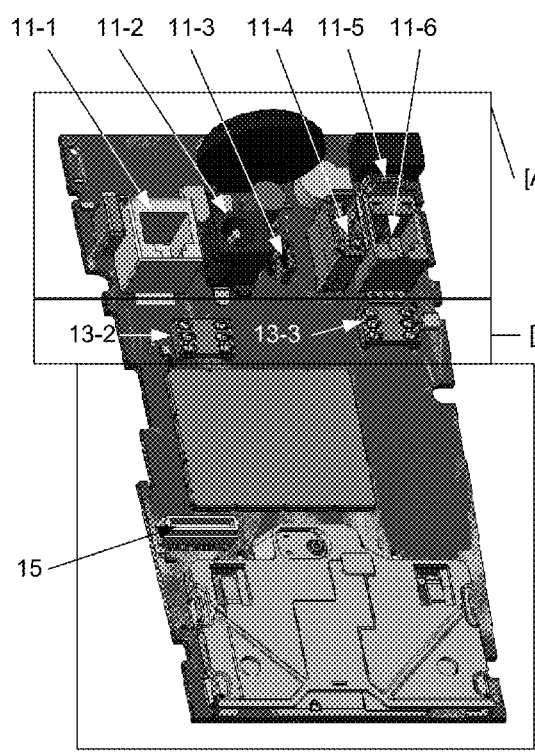
FIG. 3 shows a motherboard of a payment terminal according to the present disclosure.
Figure 4:
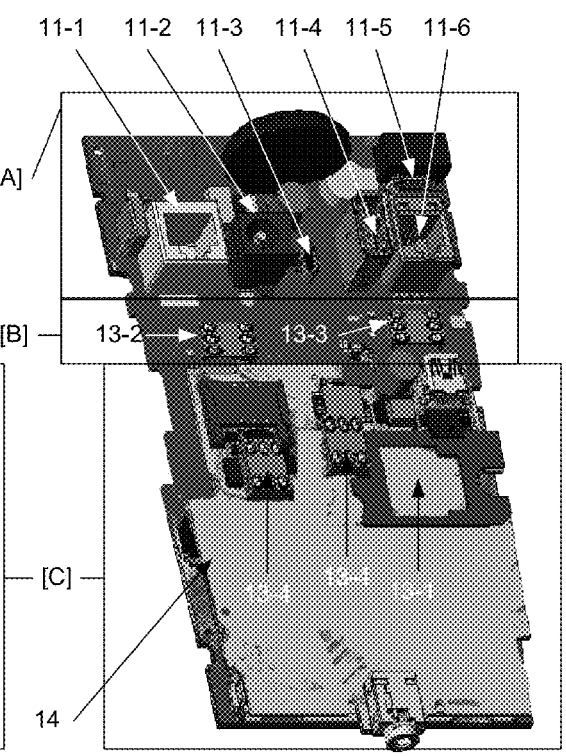
FIG. 4 shows a motherboard of a payment terminal according to the present disclosure, accompanied by an optional board.

FIGS. 3 and 4 explain the general architecture of the motherboard of the present disclosure. The elements common to the figures presented here above retain common numerical references. And in this embodiment, the areas [A] of the board is dedicated to the external jacks (11-1, 11-2, 11-3, 11-4, 11-5, 11-6) (supply, communications by Modem, Ethernet, USB, RS232). The area [B] is dedicated to the two SAM connectors (13-2, 13-3). The area [C] is occupied by components of small height. It releases substantial place for a second board (extension board) which is optional. The advantage is twofold: on the one hand, the height of the components diminishes gradually, the biggest components being situated at the top of the board. When the board is positioned in the payment terminal, this layout of the components at the top of the board corresponds to the position of the paper roll of the printer. Thus, the biggest components are situated in an area which is already thick owing to the presence of the paper roll of the payment terminal. This means that the terminal can be made more compact and that there is therefore greater freedom to work on the aesthetic aspects of the terminal. Besides, the area [B] in which the SIM and/or SAM connectors (13-2, 13-3) are laid out is situated in proximity to the area [A]. The advantage thus is that one and only one hatch is needed for access to all the connectors and jacks of the cables. The grouping of the components of the areas [A] and [B] enables improvements to be made in the terminal. Indeed, since the thickest electronic components are situated in proximity to the printer roll, the rest of the terminal can be improved, which is not the case with the prior-art terminal. Besides, since the areas [C] is reserved for low-height electronic components, it is possible to add an optional board (14) to the area [C]. The presence of such an optional board in the prior-art terminals is common. By contrast, owing to the absence of an optimized architecture, this prior-art optional board is more or less responsible for the bulge in the payment terminal. In the proposed architecture on the contrary, this optional board (14) is placed in an area [C] (cf. FIG. 6) by means of a connector 15 designed for this purpose. In general, an optional board comprises for example additional SAM card or SIM card connectors (13-4) and a microSD connector (13-1). The optional board can also include complementary communications functions such as wireless communications (Wi-Fi, Bluetooth and GPRS) modules. Thus, should the terminal be equipped with two electronic boards (a motherboard and an optional board), the extension board is situated beneath the central processing, placed in parallel and connected to it. The result of this is that the presence of the extension board at this place (area [C]) enables the areas [A] and [B] of the motherboard together to keep all the already implemented functions:

power supply;
communications by Modem RJ11;
communications by Ethernet RJ45;
USB;
RS232 serial communications;
SAM1 and SAM2 cards.

In other words, one and the same motherboard can be used to build several versions of the payment terminal. In the case of a basic version of terminal, the extension board is not added. In the case of an improved version terminal, the extension board is simply added to the connector provided for this purpose.

Depending on the embodiments, the optional board is equipped with connectors on both its faces enabling the addition of other functions to the payment terminal by the presence of connectors and links:

SAM3;
SIM1 and SIM2;
a second RS232 link;
a microSD format memory.

The layout of the connectors placed on the extension board is also chosen carefully to enable ergonomic access to all the links without making any of them inaccessible by through use of one or more other links. More particularly, according to one particular characteristic, the height of the SAM and/or SIM connectors and/or microSD connectors, both of the motherboard and of the extension board, are chosen so that all the connectors (motherboard and extension board) are situated in a same plane. Thus, the lower half-casing which covers this motherboard and the optional board has a unique plane of insertion for the SIM and/or SAM cards and/or microSD. Unlike in the terminal of the prior art, it is therefore not necessary to comply with the order of insertion of the different cards. Besides, since they are in the same insertion plane, the visibility of each connector is greater and the ergonomy is improved. More particularly, the height of the SAM connectors of the motherboard (13-2, 13-3) is arbitrarily high so as to be situated in a same plane as the connectors (13-1, 13-4) of the optional board when it is added.

FIGS. 5 and 6 explain two versions of the lower half-casing of the payment terminal in two distinct embodiments: the first embodiment, FIG. 5, relates to a half-casing intended for a terminal without optional board; the second embodiment, FIG. 6, relates to a half-casing intended for a terminal with a presence of an optional board in the terminal. The lower half-casing of FIG. 7 comprises an aperture for an RJ11 connector, an aperture for an RJ45 connector, an aperture for a power plug, an aperture for the insertion of a USB cable, an aperture for the insertion of a mini USB cable; it also comprises an aperture for two SAM cards.

The lower half-casing of FIG. 6 furthermore comprises an aperture for a first SIM card, an aperture for a second SIM card and an aperture for a third SAM card. The aperture for the microSD card is situated on the right-hand side and enables the introduction of this card more easily. The half-casing that sheaths these cards in these connections advantageously makes it possible to intimately cover these connectors, offer simplified guidance of the SAM and microSD memories, and carry clear markings of the different links in order to prevent errors of positioning or insertion.

The half-casing comes from a mold providing the possibility of molding different versions of parts corresponding to the presence or absence of the optional board. This makes the manufacture of this half-casing far more economical in an exemplary embodiment. Thus, using this technique and this architecture, the manufacture of either one of the two models of the terminal is less costly for an exemplary embodiment.

Although the present disclosure has been described with reference to one or more examples, workers skilled in the art will recognize that changes may be made in form and detail without departing from the scope of the disclosure and/or the appended claims.

The invention claimed is:
1. A printed circuit board for a payment terminal, wherein the printed circuit board comprises:
   a plurality of components comprising components of greater heights and components of smaller heights assembled on said printed circuit board according to heights of said components so that the components of greater heights are situated at a first end of the board and the components of smaller heights are situated at a second end of the board, the heights of the components diminishing gradually from the first end to the second end,
   wherein the printed circuit board takes substantially the shape of a rectangle divided into at least one first area and at least one second area, said first area comprising the components whose heights exceed a predetermined threshold height and the second area comprising the components whose heights do not exceed the predetermined threshold height, wherein said components of the first area are wired connection components and said second area comprises a plurality of SIM card or SAM card connection components, wherein all of the SIM card or SAM card connection components on the printed circuit board are configured to define a single plane of insertion of SIM cards or SAM cards with a lower half-casing of the payment terminal, at least one third area comprising the components whose height is situated below a predetermined ceiling height, which is smaller than the predetermined threshold, a first connector in the third area, an additional board connected to the first connector in the third area, and additional SIM card or SAM card connection components mounted on the additional board, wherein the heights of the SIM card or SAM card connection components of said second area are calculated so that said SIM card or SAM card connection components of said second area have heights substantially identical to heights of the additional SIM card or SAM card connection components that are mounted on the additional board.

2. The printed circuit board according to claim 1, wherein the printed circuit board furthermore comprises at least one additional board connector.

3. The printed circuit board according to claim 1, wherein the printed circuit board comprises a first connector in the third area and is shaped to receive, above the third area, an additional board connected to the first connector of the printed circuit board.

4. A payment terminal comprising a printed circuit board according to claim 1.

5. The payment terminal according to claim 4, further comprising the lower-half casing of the payment terminal, which comprises the single plane of insertion for inserting a plurality of data processing modules, including the SIM cards or SAM cards of said second area.

6. The payment terminal of claim 5, wherein the lower half casing comprises the single plane of insertion for all of the SIM card or SAM card connection components of the payment terminal.

7. A printed circuit board for a payment terminal, wherein the printed circuit board comprises:

a plurality of components comprising components of greater heights and components of smaller heights assembled on said printed circuit board according to heights of said components so that the components of greater heights are situated at a first end of the board and the components of smaller heights are situated at a second end of the board, the heights of the components diminishing gradually from the first end to the second end, wherein the printed circuit board takes substantially the shape of a rectangle divided into at least one first area and at least one second area, said first area comprising the components whose heights exceed a predetermined threshold height and the second area comprising the components whose heights do not exceed the predetermined threshold height, wherein said components of the first area are wired connection components and said second area comprises a plurality of SIM card or SAM card connection components, wherein all of the SIM card or SAM card connection components on the printed circuit board are configured to define a single plane of insertion of SIM cards or SAM cards with a lower half-casing of the payment terminal, at least one third area of the printed circuit board, a first connector in the third area, an additional board connected to the first connector in the third area, and additional SIM card or SAM card connection components mounted on the additional board, wherein the heights of the SIM card or SAM card connection components of said second area are calculated so that said SIM card or SAM card connection components of said second area have heights substantially identical to heights of the additional SIM card or SAM card connection components that are mounted on the additional board.

* * * * *